United States Patent
Tung et al.

(10) Patent No.: US 10,651,170 B2
(45) Date of Patent: May 12, 2020

(54) ISOLATED WELLS FOR RESISTOR DEVICES

(71) Applicant: Taiwan Semiconductor Manufacturing Co., Ltd., Hsin-Chu (TW)

(72) Inventors: Yu-Lung Tung, Kaohsiung (TW); Min-Chang Liang, Zhu-Dong Town (TW); Fang Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 6 days.

(21) Appl. No.: 15/646,962

(22) Filed: Jul. 11, 2017

(65) Prior Publication Data

US 2019/0019791 A1    Jan. 17, 2019

(51) Int. Cl.
| | |
|---|---|
| *H01L 27/08* | (2006.01) |
| *H01L 27/12* | (2006.01) |
| *H01L 29/06* | (2006.01) |
| *H01L 49/02* | (2006.01) |
| *H01L 21/84* | (2006.01) |
| *H01L 21/761* | (2006.01) |
| *G06F 17/50* | (2006.01) |
| *H01L 21/762* | (2006.01) |

(52) U.S. Cl.
CPC ...... *H01L 27/0802* (2013.01); *G06F 17/5036* (2013.01); *H01L 21/761* (2013.01); *H01L 21/76224* (2013.01); *H01L 21/84* (2013.01); *H01L 27/1203* (2013.01); *H01L 28/20* (2013.01); *H01L 29/0646* (2013.01)

(58) Field of Classification Search
CPC ... H01L 27/0802; H01L 21/761; H01L 21/84; H01L 29/0646; H01L 27/1203; H01L 28/20; G06F 17/5036
See application file for complete search history.

(56) References Cited

U.S. PATENT DOCUMENTS

| | | | |
|---|---|---|---|
| 5,600,176 | A | 2/1997 | Bucksch |
| 6,369,409 | B1 | 4/2002 | Takasu et al. |
| 9,013,845 | B1* | 4/2015 | Karp ........................ H02H 3/20 |
| | | | 361/56 |
| 2008/0160686 | A1 | 7/2008 | Nakamatsu et al. |
| 2009/0179689 | A1 | 7/2009 | Bolam et al. |
| 2010/0109775 | A1 | 5/2010 | Kamakura et al. |
| 2011/0318897 | A1* | 12/2011 | Shang ............... H01L 21/76229 |
| | | | 438/382 |

(Continued)

FOREIGN PATENT DOCUMENTS

| | | |
|---|---|---|
| CN | 103515385 A | 1/2014 |
| JP | 2013197487 | 9/2013 |

(Continued)

*Primary Examiner* — Syed I Gheyas
(74) *Attorney, Agent, or Firm* — Haynes and Boone, LLP

(57) ABSTRACT

A semiconductor device includes a substrate, a dielectric layer over the substrate, a first resistor element embedded within the dielectric layer, a second resistor element embedded within the dielectric layer, a first doped well within the substrate, the first doped well being aligned with the first resistor element, and a second doped well within the substrate, the second doped well being aligned with the second resistor element, the second doped well being non-contiguous with the first doped well.

20 Claims, 10 Drawing Sheets

(56) References Cited

U.S. PATENT DOCUMENTS

| | | | |
|---|---|---|---|
| 2012/0280361 A1* | 11/2012 | Su | ........................ H01L 27/0802 |
| | | | 257/538 |
| 2013/0207221 A1 | 8/2013 | McMullan et al. | |
| 2013/0335249 A1 | 12/2013 | Iadanza | |
| 2013/0341760 A1 | 12/2013 | Kikuchi et al. | |
| 2014/0264753 A1* | 9/2014 | Yen | .......................... H01L 28/20 |
| | | | 257/536 |
| 2017/0117272 A1 | 4/2017 | Sio et al. | |

FOREIGN PATENT DOCUMENTS

| | | |
|---|---|---|
| JP | 2016521919 A | 7/2016 |
| KR | 20120023917 A | 3/2012 |
| TW | 201005922 | 2/2010 |
| TW | 201606995 | 2/2016 |
| TW | 201711154 | 3/2017 |

\* cited by examiner

ISOLATED WELLS FOR RESISTOR DEVICES

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

Integrated circuits include many components, such as transistors, capacitors, and resistors. Resistors are often formed by depositing a conductive line of a particular length within an interlayer dielectric (ILD) layer. The desired resistance of a particular resistor may be set by controlling the length of the conductive line. In some examples, the resistance may be controlled by doping the conductive line with various dopants. Conductive lines, such as those used for resistors, may form capacitive coupling with the substrate below the ILD layer. For example, the substrate may be a p-substrate with an n-well formed therein. The n-well may provide a common capacitive coupling for an array of resistors. This capacitive coupling may limit the use of such resistor arrays. For example, when simulating such circuits, the accuracy of the simulations may only be sufficient if each of the resistors in the array function together rather than individually. It would be desirable to have resistor arrays that do not suffer from such limitations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
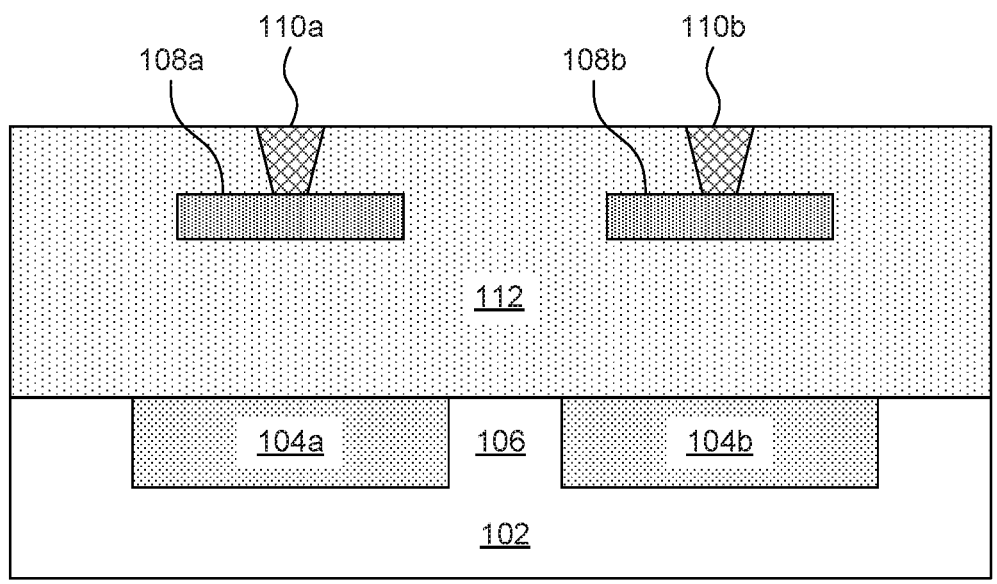
FIGS. 1A and 1B are diagrams showing a resistor array above an array of non-contiguous wells, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, resistor arrays are typically capacitive coupled through a contiguous well (e.g., an n-well) within the substrate underneath the dielectric layer in which the resistor array is formed. Such capacitive coupling may limit the functionality of the circuit. Additionally, as described above, such capacitive coupling may reduce the accuracy of simulations in which different resistors within the array are not being used simultaneously.

According to principles described herein, the capacitive coupling between resistors in the array may be reduced by forming the wells underneath such that they are non-contiguous. In other words, the well beneath one resistor in the array may be isolated from the well below the adjacent resistor in the array. Such a structure allows for a more flexible circuit design and for more accurate simulations of such circuits.

Figure 1B:
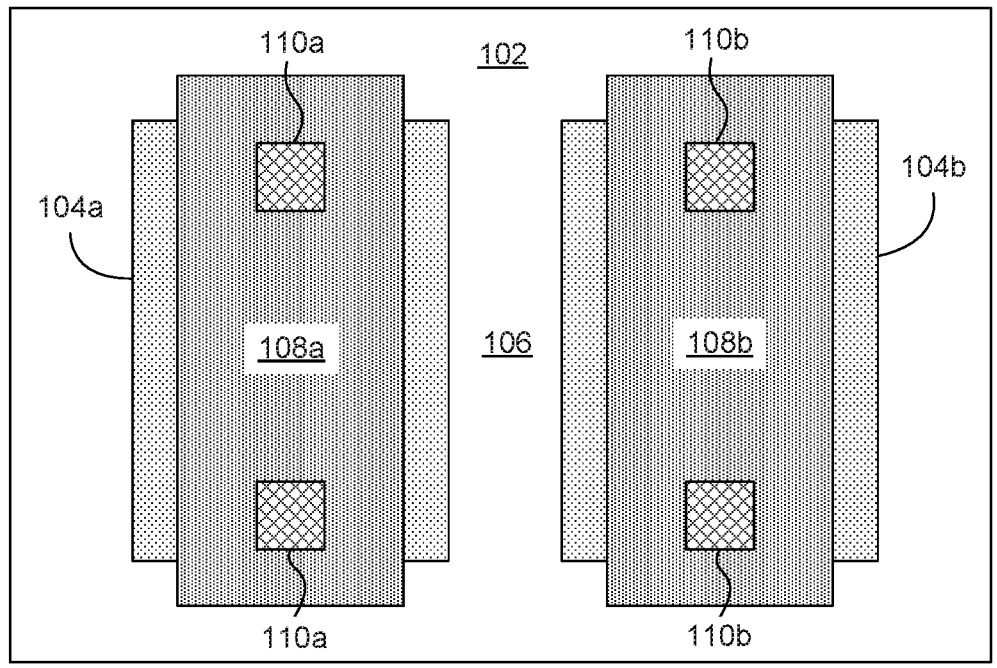

FIGS. 1A and 1B are diagrams showing a resistor array above an array of non-contiguous wells 104a, 104b. The non-contiguous wells 104a, 104b may also be referred to as isolated wells 104a, 104b. FIG. 1A illustrates a substrate 102, isolated wells 104a, 104b, an ILD layer 112, resistor elements 108a, 108b, and vias 110a, 110b. The substrate 102 may be a semiconductor substrate such as a silicon substrate. In some examples, the substrate 102 may be lightly doped with a p-type dopant such as boron. Such a substrate 102 may be referred to as a p-substrate. The substrate 102 may be part of a semiconductor wafer used in semiconductor fabrication processes. Such wafers are often circular and about 300 millimeters in diameter. Other sizes may be used as well.

The isolated wells 104a, 104b are formed into the substrate 102. In the present example, the isolated wells 104a, 104b are n-wells. However, in some examples, the isolated wells 104a, 104b may be p-wells. The isolated n-wells 302a, 302b may be formed by applying a doping process to the substrate 102. Various photolithographic techniques may be used to form the desired pattern of the isolated wells 104a, 104b. For example, a photoresist layer may be applied to the substrate. The photoresist layer may then be exposed to a light source through a photomask. The exposed photoresist layer may then be developed so that parts of the substrate 102 are exposed through removed portions of the photoresist layer. Then, a doping process, such as an ion implantation process, may be applied to the substrate 102. The remaining portions of photoresist will protect the substrate from the doping process such that covered portions of the substrate 102 are not doped. The isolated wells 104a, 104b may be doped with an n-type dopant such as arsenic. The concentration of n-type dopants may be higher than the concentration of p-type dopants within the substrate 102. In alternative embodiments, a hard mask may be used as an implantation mask to form the isolated wells 104a, 104b. For example, a hard mask layer, such as silicon oxide, silicon nitride or both, is deposited on the substrate 102; a patterned photoresist layer is formed on the hard mask layer by a lithography technique, where the patterned photoresist layer includes openings that define regions for the isolated wells 104a and 104b; an etching process is applied to the hard mask layer to transfer the openings from the photoresist layer to the hard mask layer; and an ion implantation process is applied to the substrate 102 to form the isolated wells 104a, 104b using the patterned hard mask layer as an implantation mask.

The isolated n-wells 104a, 104b may be formed such that there is an array of non-contiguous n-wells 104a, 104b. In other words, there may be gaps between the n-wells 104a, 104b. The structures in the gaps function to electrically isolate the wells 104a, 104b and may be referred to as isolation regions 106. In the present example, the isolation region 106 comprises a portion of the p-doped substrate 102. Thus, there are p-n junctions where the wells 104a, 104b meet the isolation region 106. In some examples, instead of a portion of the p-substrate being within the isolation region 106, there may be other types of material. For example, a shallow trench isolation (STI) structure may be formed between the wells 104a, 104b. An STI structures comprises a dielectric material and is formed for the purpose of isolating regions within the semiconductor substrate. An STI structure may be formed in a variety of manners. In one example, an STI structure may be formed by performing an etching process through a patterned photoresist or mask to form trenches. The photoresist or mask may be patterned such that regions where the STI features are to be formed are exposed. A deposition process may then be applied to fill the trenches with the STI material. Then, a Chemical Mechanical Polishing (CMP) process may be applied to planarize the surface of the substrate.

In some examples, the isolated wells 104a, 104b may be floating. In other words, they may not be connected to a voltage supply line. In some examples, however, the isolated wells 104a, 104b may be connected to a voltage supply line. The substrate 102 may be grounded.

After the wells are formed, an ILD layer 112 may be formed on top of the substrate 102. The ILD layer 112 is a dielectric layer. The ILD layer 112 have a number of circuit features formed therein such as metal conductive lines and vias. In the present example, a resistor array is formed within the ILD layer 112. The resistor array includes a first resistor element 108a and a second resistor element 108b. The resistor elements are elongated lines that run parallel with the substrate. The first resistor element 108a extends between two vias 110a. Similarly, the second resistor element 108b extends between two vias 110b. The resistor elements 108a, 108b may be designed with particular lengths and materials so that they have the desired resistance.

FIG. 1B illustrates a top view of the resistor elements 108a, 108b. As can be seen, the resistor elements 108a, 108b are arranged as elongated conductive elements. Even conductive materials have some resistance. The total resistance of a particular resistor element may be a function of its length. Thus, the length of the resistor elements 108a, 108b may be designed to have a specific resistance. In some examples, if the conductive material used for the resistor elements is a semiconductor, such as polysilicon, then the resistor elements may be implanted with a dopant species to tune the resistance.

From the top view, the elongated resistor elements 108a, 108b can be seen extending between vias 110a, 110b. Specifically, resistor element 108a extends between two vias 108a and resistor element 108b extends between two vias 110b. Additionally, each of the resistor elements is positioned above one of the n-wells 104a, 104b. The isolated wells 104a, 104b may be separated from each other by approximately 10 nanometers. Other distances are contemplated as well. As described above, the isolated wells 104a, 104b are isolated from each other so as to reduce capacitive coupling between the two resistor elements 108a, 108b.

In some examples, the resistors 108a, 108b may be formed by a damascene process. In a damascene process, the ILD layer 112 is patterned to form trenches by lithography patterning and etching; one or more conductive material (such as metal, metal alloy, or silicide) is deposited to fill in the trenches; and a chemical mechanical polishing (CMP) process is applied to remove excessive conductive material. The resistors 108a, 108b may be formed in a same procedure to form metal lines.

Figure 2A:
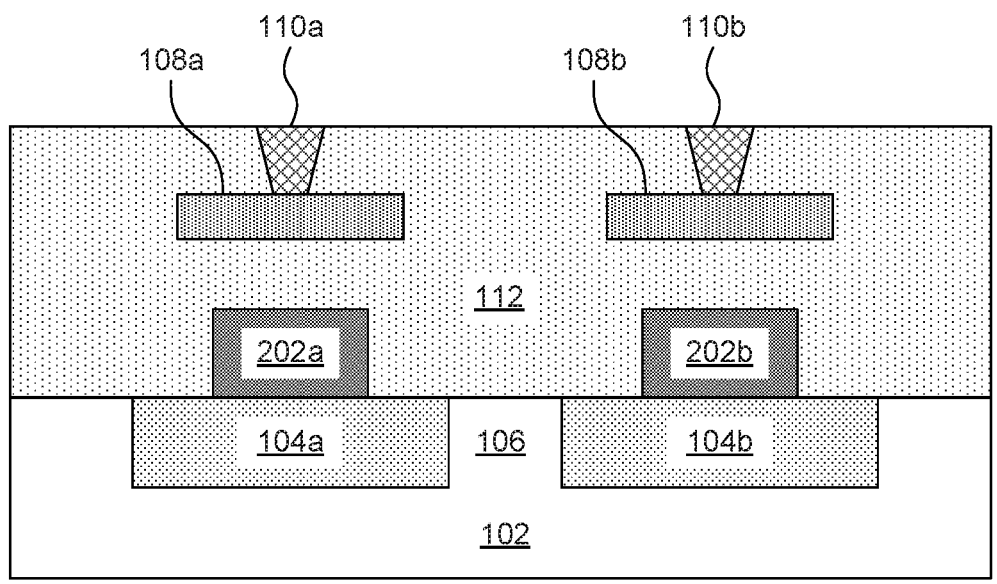
FIGS. 2A and 2B are diagrams showing a resistor array above an array of non-contiguous wells and gate structures, according to one example of principles described herein.
Figure 2B:
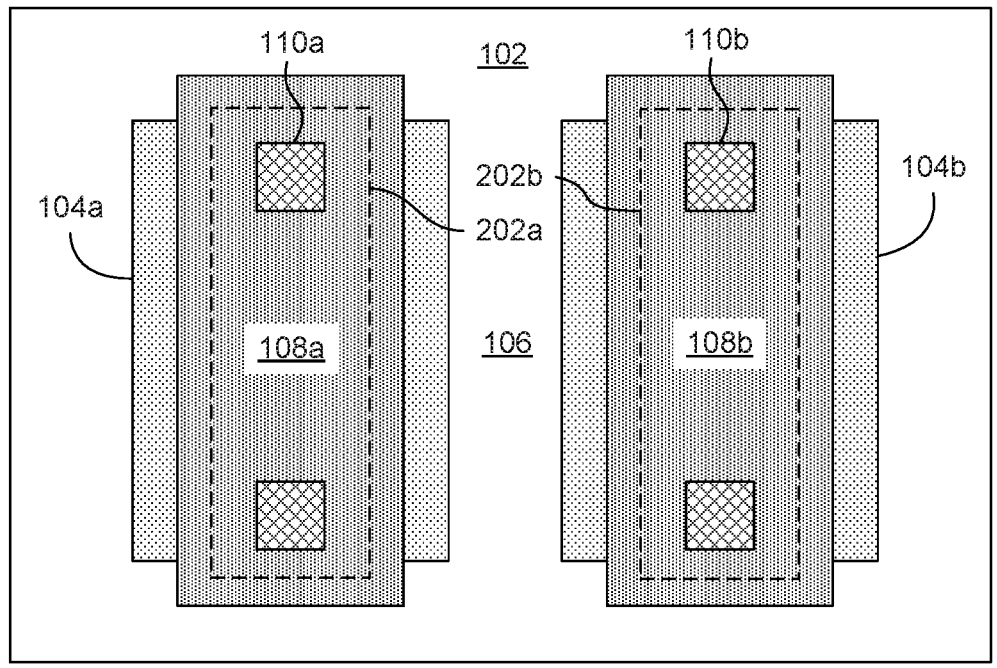

FIGS. 2A and 2B are diagrams showing a resistor array above an array of non-contiguous wells 104a, 104b and gate structures 202a, 202b. FIG. 2A illustrates the substrate 102, isolated wells 104a, 104b, gate structures 202a, 202b, an ILD layer 112, resistor elements 108a, 108b, and vias 110a, 110b. As described above, the substrate 102 may be a semiconductor substrate such as a silicon substrate. In some examples, the substrate 102 may be lightly doped with a p-type dopant such as boron.

The wells 104a, 104b may be formed into the substrate 102. In the present example, the isolated wells 104a, 104b are n-wells. However, in some examples, the isolated wells 104a, 104b may be p-wells. The isolated wells 104a, 104b may be formed by applying a doping process to the substrate 102. Various photolithographic techniques may be used to form the desired pattern of the isolated wells 104a, 104b. For example, a photoresist layer may be applied to the substrate. The photoresist layer may then be exposed to a light source through a photomask. The exposed photoresist layer may then be developed so that parts of the substrate 102 are exposed through removed portions of the photoresist layer. Then, a doping process, such as an ion implantation process, may be applied to the substrate 102. The remaining portions of photoresist will protect the substrate 102 from the doping process such that covered portions of the substrate are not doped. The isolated wells 104a, 104b may be doped with an n-type dopant such as arsenic. The concentration of n-type dopants may be higher than the concentration of p-type dopants within the substrate 102.

The isolated wells 104a, 104b may be formed such that there is an array of non-contiguous wells 104a, 104b. In other words, there may be gaps between the isolated wells 104a, 104b. The gaps may be referred to as isolation regions 106. In the present example, the isolation region 106 comprises a portion of the p-doped substrate 102. Thus, there are p-n junctions where the wells 104a, 104b meet the isolation region 106. In some examples, instead of a portion of the p-substrate being within the isolation region 106, there may be other types of material. For example, a shallow trench isolation (STI) structure may be formed between the wells 104a, 104b. In some examples, the isolated wells 104a, 104b may be floating. In other words, they may not be connected to a voltage supply line. In some examples, however, the isolated wells 104a, 104b may be connected to a voltage supply line. The substrate 102 may be grounded.

After the isolated wells 104a, 104b are formed, gate structures 202a, 202b may be formed on top of the wells. In some examples, the gate structures 202a, 202b may be dummy gate structures. In other words, the gate structures 202a, 202b may not serve a function in the integrated circuit being formed on the substrate 102. In some examples, the gate structures 202a, 202b may be real gate structures. In other words, the gate structures 202a, 202b may have a function within the integrated circuit being formed on the substrate 102. It may be desirable to form dummy gate structures for various fabrication benefits. For example, it may be beneficial to form dummy gate structures so that the pattern density of gate structures on the substrate is substantially similar throughout a particular region. This helps with depth of focus issues during the photolithographic process used to form gate structures 202a, 202b, including both dummy gate structures and real gate structures.

After the dummy gate structures 202a, 202b are formed, an ILD layer 112 may be formed on top of the substrate 102. The ILD layer 112 is a dielectric layer. The ILD layer 112 have a number of circuit features formed therein such as metal conductive lines and vias. In the present example, a resistor array is formed within the ILD layer 112. The resistor array includes a first resistor element 108a and a second resistor element 108b. The resistor elements are elongated lines that run parallel with the substrate. The first resistor element 108a extends between two vias 110a. Similarly, the second resistor element 108b extends between two vias 110b. The resistor elements 108a, 108b may be designed with particular lengths and materials so that they have the desired resistance.

FIG. 2B illustrates a top view of the resistor elements 108a, 108b. As can be seen, the resistor elements 108a, 108b are arranged as elongated conductive elements. From the top view, the elongated resistor elements 108a, 108b can be seen extending between vias 110a, 110b. Specifically, resistor element 108a extends between two vias 108a and resistor element 108b extends between two vias 110b. Additionally, each of the resistor elements is positioned above one of the n-wells 104a, 104b. Additionally, the position of the gate structures 202a, 202b is identified by the dotted lines. As described above, the n-wells 104a, 104b are isolated from each other so as to reduce capacitive coupling between the two resistor elements 108a, 108b. The dummy gate structures can be added while still allowing for reduced capacitive coupling between resistor elements 108a, 108b. In some examples, the gate structures 202a, 202b may be floating. In some examples, however, the gate structures may be connected to a voltage line.

Figure 3A:
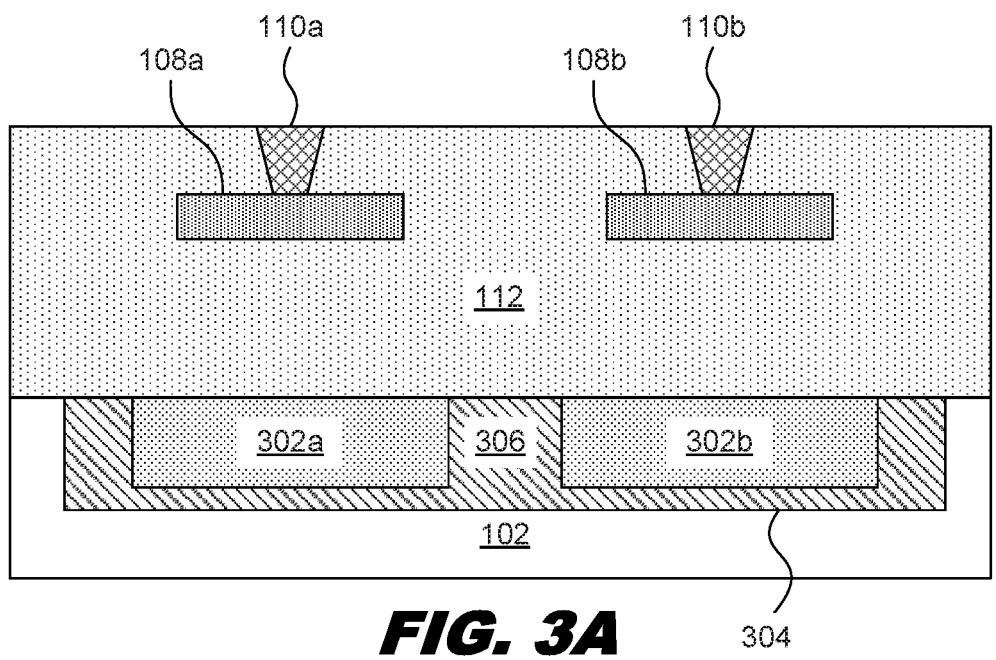
FIGS. 3A and 3B are diagrams showing a resistor array above an array of non-contiguous wells within a contiguous well, according to one example of principles described herein.
Figure 3B:
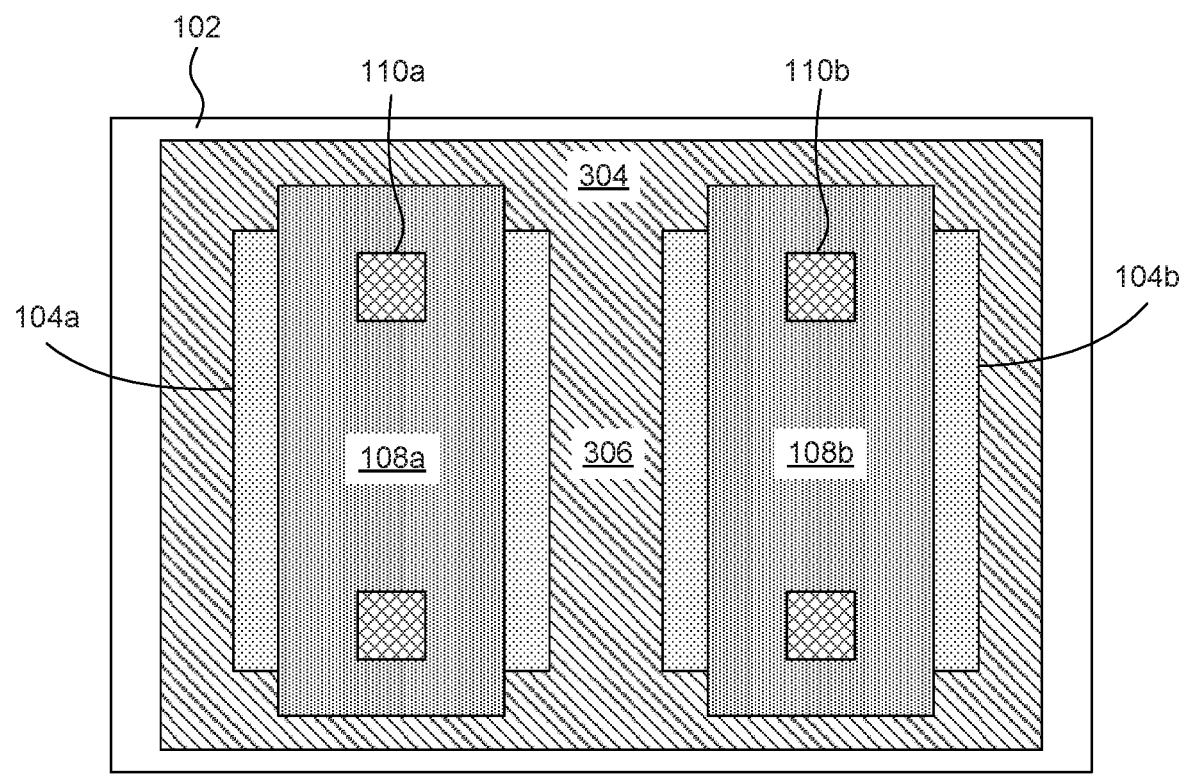

FIGS. 3A and 3B are diagrams showing a resistor array above an array of non-contiguous wells 302a, 302b within a contiguous well 306. FIG. 3A illustrates the substrate 102, isolated wells 302a, 302b, a contiguous well 306, an ILD layer 112, resistor elements 108a, 108b, and vias 110a, 110b. The substrate 102 may be a semiconductor substrate such as a silicon substrate. In some examples, the substrate 102 may be lightly doped with a p-type dopant such as boron.

The contiguous well 306 may be formed into the substrate 102. In the present example, the contiguous well is doped with an n-type dopant, such as Arsenic. Thus, the contiguous well may be referred to as a contiguous n-well. The contiguous well 306 may have a higher doping concentration than that of the substrate. More specifically, the n-type dopant concentration of the contiguous well 306 may be greater than the p-type dopant concentration of the substrate 102. The contiguous well may be formed by applying a doping process to the substrate. Various photolithographic techniques may be used to form the desired pattern of the contiguous well 306. For example, a photoresist layer may be applied to the substrate. The photoresist layer may then be exposed to a light source through a photomask. The exposed photoresist layer may then be developed so that parts of the substrate 102 are exposed through removed portions of the photoresist layer. Then, a doping process, such as an ion implantation process, may be applied to the substrate.

The isolated wells 302a, 302b are formed into the substrate 102 and within the contiguous n-well. In the present example, the isolated wells 302a, 302b are p-wells and the contiguous well 306 is an n-well. However, in some examples, the isolated wells 302a, 302b may be n-wells and the contiguous well 306 may be a p-well. The isolated wells 302a, 302b may be formed by applying a doping process to the substrate. Various photolithographic techniques may be used to form the desired pattern of isolated wells 302a, 302b. For example, a photoresist layer may be applied to the substrate. The photoresist layer may then be exposed to a light source through a photomask. The exposed photoresist layer may then be developed so that parts of the substrate 102 are exposed through removed portions of the photoresist layer. Then, a doping process, such as an ion implantation process, may be applied to the substrate. The remaining portions of photoresist will protect the substrate from the doping process such that covered portions of the substrate are not doped. The isolated wells 302a, 302b may be doped with a p-type dopant. The concentration of p-type dopants in the isolated wells 302a, 302b may be similar to the concentration of dopants in the contiguous well 306.

The isolated p-wells 302a, 302b may be formed such that there is an array of non-contiguous p-wells 302a, 302b. In other words, there may be gaps between the p-wells 302a, 302b. The gaps may be referred to as isolation regions. In the present example, the isolation region comprises a portion of the contiguous well 306. Thus, there are p-n junctions where the wells 302a, 302b meet the isolation region. In some examples, instead of a portion of the contiguous well 306 being within the isolation region, there may be other types of material. For example, a shallow trench isolation (STI) structure may be formed between the wells 302a, 302b.

After the wells 302a, 302b are formed, an ILD layer 112 may be formed on top of the substrate 102. The ILD layer 112 is a dielectric layer. The ILD layer 112 have a number of circuit features formed therein such as metal conductive lines and vias. In the present example, a resistor array is formed within the ILD layer 112. The resistor array includes a first resistor element 108a and a second resistor element 108b. The first resistor element 108a extends between two vias 110a. Similarly, the second resistor element 108b extends between two vias 110b. The resistor elements 108a, 108b may be designed with particular lengths and materials so that they have the desired resistance.

FIG. 3B illustrates a top view of the resistor elements 108a, 108b. As can be seen, the resistor elements 108a, 108b are arranged as elongated conductive elements. From the top view, the elongated resistor elements 108a, 108b can be seen extending between vias 110a, 110b. Specifically, resistor element 108a extends between two vias 108a and resistor element 108b extends between two vias 110b. Additionally, each of the resistor elements is positioned above one of the isolated wells 302a, 302b. The isolated wells 302a, 302b can be seen positioned within the contiguous, deeper well 306. As described above, the wells 302a, 302b are isolated from each other so as to reduce capacitive coupling between the two resistor elements 108a, 108b. In some examples, the isolated wells 302a, 302b may be floating. In other words, they may not be connected to a voltage supply line. In some examples, however, the isolated wells 302a, 302b may be connected to a voltage supply line. The substrate 102 may be grounded.

Figure 4A:
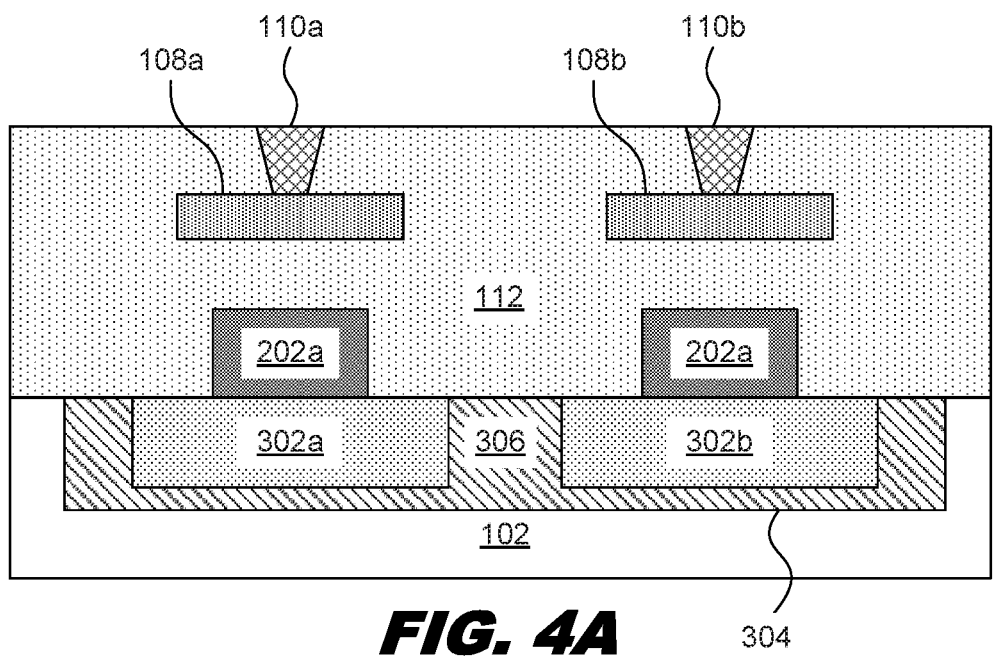
FIGS. 4A and 4B are diagrams showing a resistor array above an array of non-contiguous wells and gate structures within a contiguous well, according to one example of principles described herein.
Figure 4B:
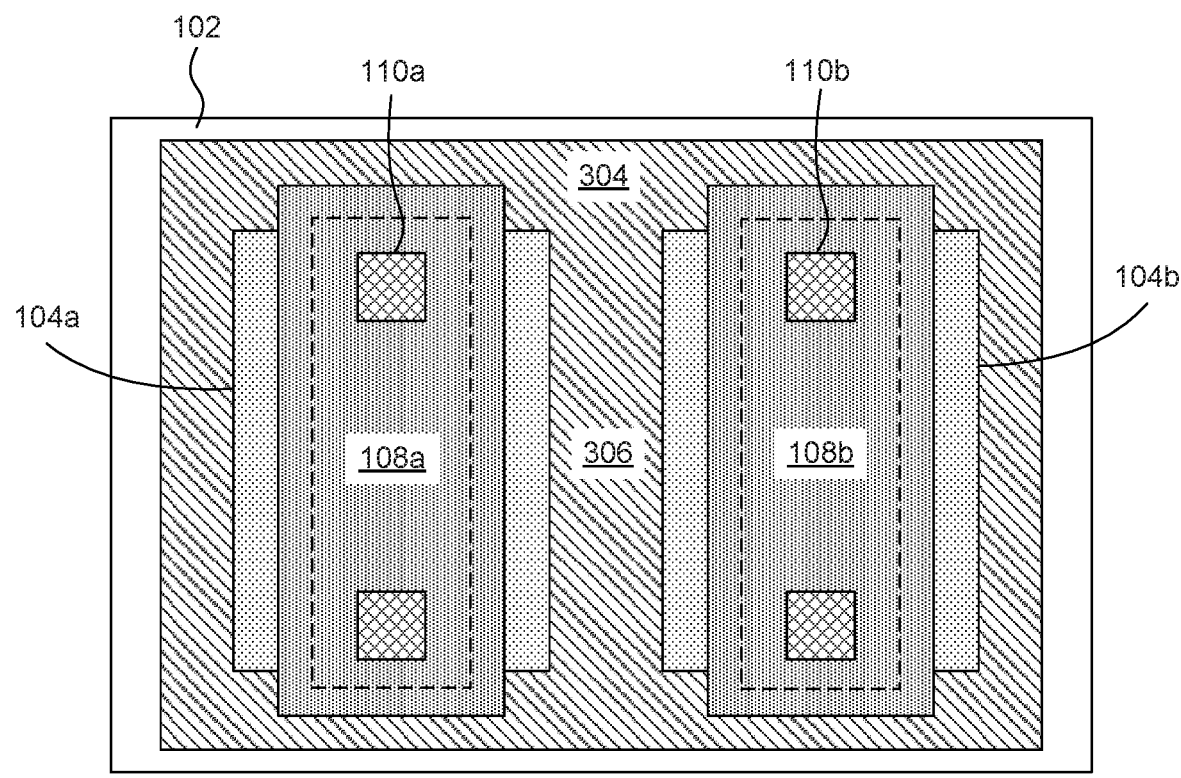

FIGS. 4A and 4B are diagrams showing a resistor array above gate structures 202a, 202b and an array of non-contiguous wells 302a, 302b within a contiguous well 306. FIG. 4A illustrates the substrate 102, isolated wells 302a, 302b, a contiguous well 306, gate structures, 202a, 202b, an ILD layer 112, resistor elements 108a, 108b, and vias 110a, 110b. The substrate 102 may be a semiconductor substrate such as a silicon substrate. In some examples, the substrate 102 may be lightly doped with a p-type dopant such as boron.

The contiguous well 306 may be formed into the substrate 102. In the present example, the contiguous well is doped with an n-type dopant, such as Arsenic. Thus, the contiguous well may be referred to as a contiguous n-well. The contiguous well 306 may have a higher doping concentration than that of the substrate. More specifically, the n-type dopant concentration of the contiguous well 306 may be greater than the p-type dopant concentration of the substrate 102. The contiguous well may be formed by applying a doping process to the substrate. Various photolithographic techniques may be used to form the desired pattern of the contiguous well 306. For example, a photoresist layer may be applied to the substrate. The photoresist layer may then be exposed to a light source through a photomask. The exposed photoresist layer may then be developed so that parts of the substrate 102 are exposed through removed portions of the photoresist layer. Then, a doping process, such as an ion implantation process, may be applied to the substrate.

The isolated wells 302a, 302b are formed into the substrate 102 and within the contiguous n-well. In the present example, the isolated wells 302a, 302b are p-wells and the contiguous well 306 is an n-well. However, in some examples, the isolated wells 302a, 302b may be n-wells and the contiguous well 306 may be a p-well. The isolated wells 302a, 302b may be formed by applying a doping process to the substrate. Various photolithographic techniques may be used to form the desired pattern of isolated wells 302a, 302b. For example, a photoresist layer may be applied to the substrate. The photoresist layer may then be exposed to a light source through a photomask. The exposed photoresist layer may then be developed so that parts of the substrate 102 are exposed through removed portions of the photoresist layer. Then, a doping process, such as an ion implantation process, may be applied to the substrate. The remaining portions of photoresist will protect the substrate from the doping process such that covered portions of the substrate are not doped. The isolated wells 302a, 302b may be doped with a p-type dopant. The concentration of p-type dopants in the isolated wells 302a, 302b may be similar to the concentration of dopants in the contiguous well 306.

The isolated p-wells 302a, 302b may be formed such that there is an array of non-contiguous p-wells 302a, 302b. In other words, there may be gaps between the p-wells 302a, 302b. The gaps may be referred to as isolation regions. In the present example, the isolation region comprises a portion of the contiguous well 306. Thus, there are p-n junctions where the wells 302a, 302b meet the isolation region. In some examples, instead of a portion of the contiguous well 306 being within the isolation region, there may be other types of material. For example, a shallow trench isolation (STI) structure may be formed between the wells 302a, 302b.

After the isolated wells 302a, 302b are formed, gate structures 202a, 202b may be formed on top of the wells 302a, 302b. In some examples, the gate structures 202a, 202b may be dummy gate structures. In other words, the gate structures 202a, 202b may not serve a function in the integrated circuit being formed on the substrate 102. In some examples, the gate structures 202a, 202b may be real gate structures. In other words, the gate structures 202a, 202b may have a function within the integrated circuit being formed on the substrate 102. It may be desirable to form dummy gate structures for various fabrication benefits. For example, it may be beneficial to form dummy gate structures so that the pattern density of gate structures on the substrate is substantially similar throughout a particular region. This helps with depth of focus issues during the photolithographic process used to form gate structures 202a, 202b, including both dummy gate structures and real gate structures.

After the gate structures 202a, 202b are formed, an ILD layer 112 may be formed on top of the substrate 102. The ILD layer 112 is a dielectric layer. The ILD layer 112 have a number of circuit features formed therein such as metal conductive lines and vias. In the present example, a resistor array is formed within the ILD layer 112. The resistor array includes a first resistor element 108a and a second resistor element 108b. The first resistor element 108a extends between two vias 110a. Similarly, the second resistor element 108b extends between two vias 110b. The resistor elements 108a, 108b may be designed with particular lengths and materials so that they have the desired resistance.

FIG. 4B illustrates a top view of the resistor elements 108a, 108b. As can be seen, the resistor elements 108a, 108b are arranged as elongated conductive elements. From the top view, the elongated resistor elements 108a, 108b can be seen extending between vias 110a, 110b. Specifically, resistor element 108a extends between two vias 108a and resistor element 108b extends between two vias 110b. Additionally, each of the resistor elements is positioned above one of the isolated wells 302a, 302b. The isolated wells 302a, 302b can be seen positioned within the contiguous, deeper well 306. As described above, the wells 302a, 302b are isolated from each other so as to reduce capacitive coupling between the two resistor elements 108a, 108b. In some examples, the isolated wells 302a, 302b may be floating. In other words, they may not be connected to a voltage supply line. In some examples, however, the isolated wells 302a, 302b may be connected to a voltage supply line. The substrate 102 may be grounded.

Figure 5A:
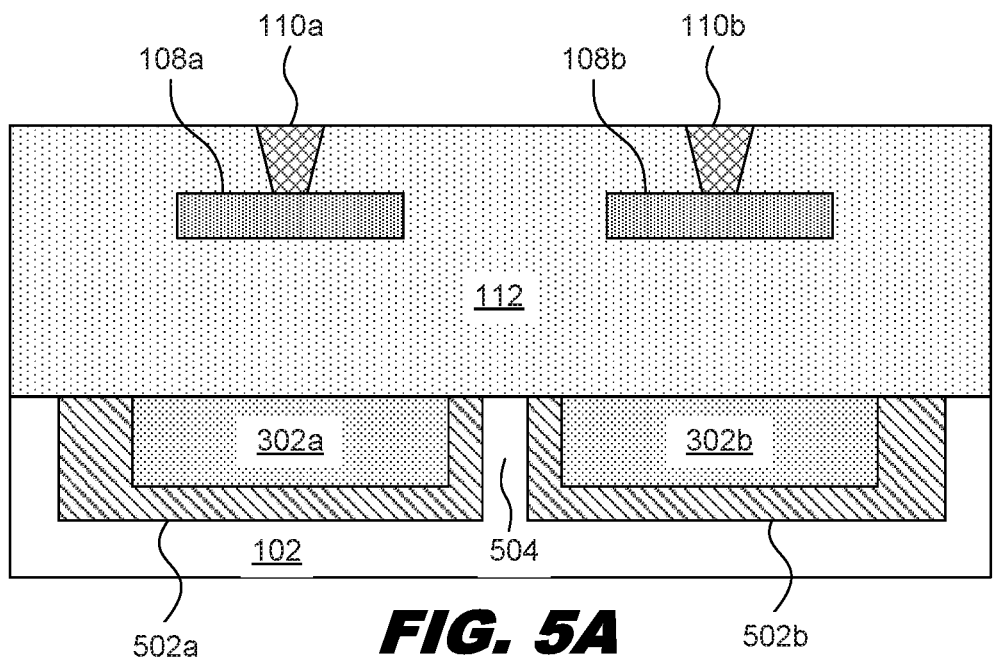
FIGS. 5A and 5B are diagrams showing a resistor array above an array of non-contiguous wells within non-contiguous wells of a different conductivity type, according to one example of principles described herein.
Figure 5B:
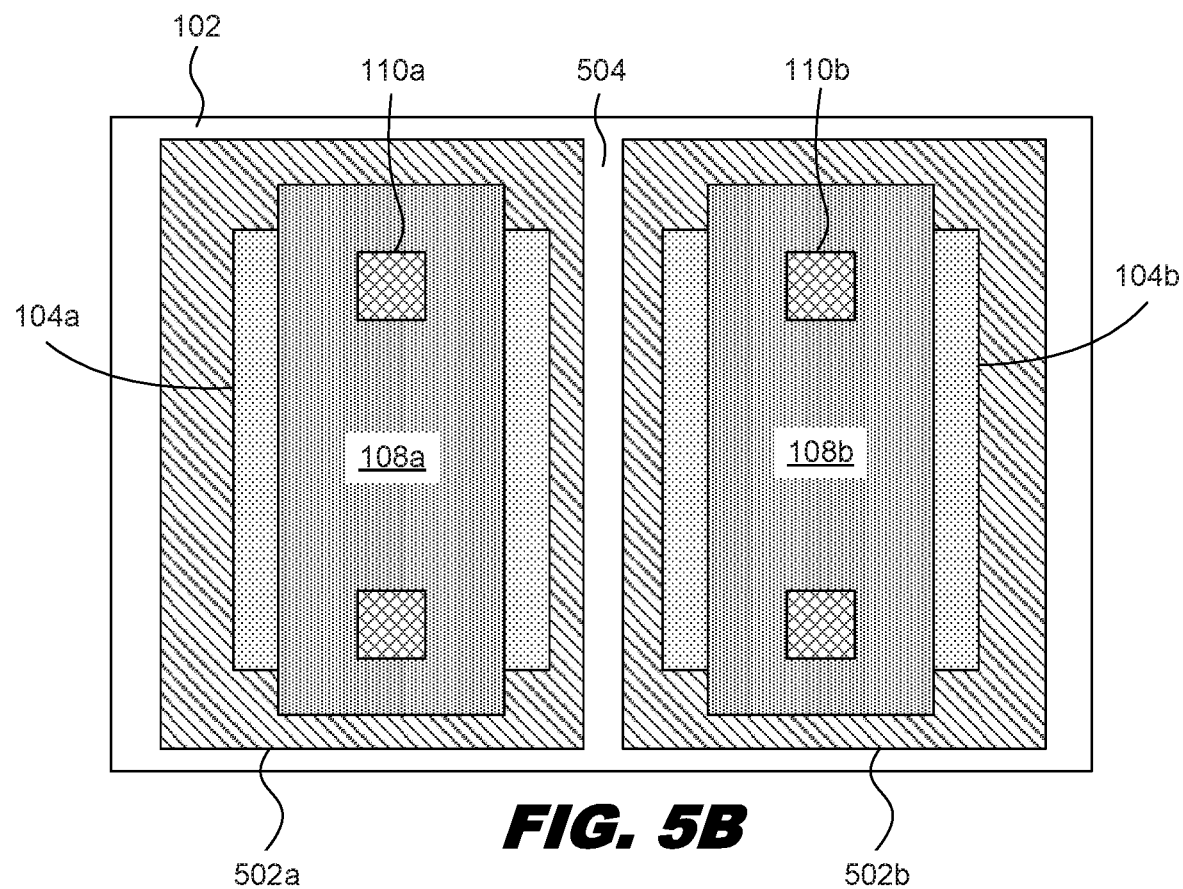

FIGS. 5A and 5B are diagrams showing a resistor array above an array of non-contiguous wells 302a, 302b within non-contiguous wells 502a, 502b. FIG. 5A illustrates the substrate 102, isolated wells 302a, 302b of a first conductivity type, isolated wells 502a, 502b of a second conductivity type, an ILD layer 112, resistor elements 108a, 108b, and vias 110a, 110b. The substrate 102 may be a semiconductor substrate such as a silicon substrate. In some examples, the substrate 102 may be lightly doped with a p-type dopant such as boron.

The isolated wells 502a 502b may be formed into the substrate 102 before the isolated wells 302a, 302b are formed. In the present example, the isolated wells 502a, 502b are doped with an n-type dopant, such as Arsenic. Thus, the wells 502a, 502b may also be referred to as isolated n-wells 502a, 502b. The isolated n-wells 502a, 502b may have a higher doping concentration than that of the substrate 102. More specifically, the n-type dopant concentration of the isolated n-wells 502a, 502b may be greater than the p-type dopant concentration of the substrate 102. The isolated n-wells 502a, 502b may be formed by applying a doping process to the substrate. Various photolithographic techniques may be used to form the desired pattern of the isolated n-wells 502a, 502b. For example, a photoresist layer may be applied to the substrate. The photoresist layer may then be exposed to a light source through a photomask. The exposed photoresist layer may then be developed so that parts of the substrate 102 are exposed through removed portions of the photoresist layer. Then, a doping process, such as an ion implantation process, may be applied to the substrate.

After the isolated n-wells 502a, 502b are formed, the isolated wells 302a, 302b are formed. In the present example, the isolated wells 302a, 302b are p-wells and may thus be referred to as isolated p-wells 502a, 502b. However, in some examples, the isolated wells 302a, 302b may be n-wells and the isolated 502a, 502b may be p-wells. The isolated wells 302a, 302b may be formed by applying a doping process to the substrate. Various photolithographic techniques may be used to form the desired pattern of isolated wells 302a, 302b. For example, a photoresist layer may be applied to the substrate. The photoresist layer may then be exposed to a light source through a photomask. The exposed photoresist layer may then be developed so that parts of the substrate 102 are exposed through removed portions of the photoresist layer. Then, a doping process, such as an ion implantation process, may be applied to the substrate. The remaining portions of photoresist will protect the substrate from the doping process such that covered portions of the substrate are not doped. The isolated wells 302a, 302b may be doped with a p-type dopant. The concentration of p-type dopants in the isolated wells 302a, 302b may be similar to the concentration of dopants in the isolated n-wells 502a, 502b. In some examples, the isolated wells 302a, 302b and the isolated wells 502a, 502b may have different doping concentrations.

The isolated wells 502a, 502b may be formed such that there is an array of non-contiguous wells 502a, 502b. The gaps may be referred to as isolation regions 504. In the present example, the isolation region comprises a portion of the p-substrate 102. Thus, there are p-n junctions where the wells 502a, 502b meet the isolation region 504. In some examples, instead of a portion of the p-substrate 102 being within the isolation region, there may be other types of material. For example, a shallow trench isolation (STI) structure may be formed between the wells 302a, 302b.

After the wells 302a, 302b are formed, an ILD layer 112 may be formed on top of the substrate 102. The ILD layer 112 is a dielectric layer. The ILD layer 112 have a number of circuit features formed therein such as metal conductive lines and vias. In the present example, a resistor array is formed within the ILD layer 112. The resistor array includes a first resistor element 108a and a second resistor element 108b. The first resistor element 108a extends between two vias 110a. Similarly, the second resistor element 108b extends between two vias 110b. The resistor elements 108a, 108b may be designed with particular lengths and materials so that they have the desired resistance.

FIG. 5B illustrates a top view of the resistor elements 108a, 108b. As can be seen, the resistor elements 108a, 108b are arranged as elongated conductive elements. From the top view, the elongated resistor elements 108a, 108b can be seen extending between vias 110a, 110b. Specifically, resistor element 108a extends between two vias 108a and resistor element 108b extends between two vias 110b. Additionally, each of the resistor elements is positioned above one of the isolated wells 302a, 302b. The isolated wells 302a, 302b can be seen positioned within the isolated wells 502a, 502b. As described above, the wells 302a, 302b, 502a, 502b are isolated from each other so as to reduce capacitive coupling between the two resistor elements 108a, 108b. In some examples, the isolated wells 302a, 302b may be floating. In other words, they may not be connected to a voltage supply line. In some examples, however, the isolated wells 302a, 302b may be connected to a voltage supply line. The substrate 102 may be grounded.

Figure 6A:
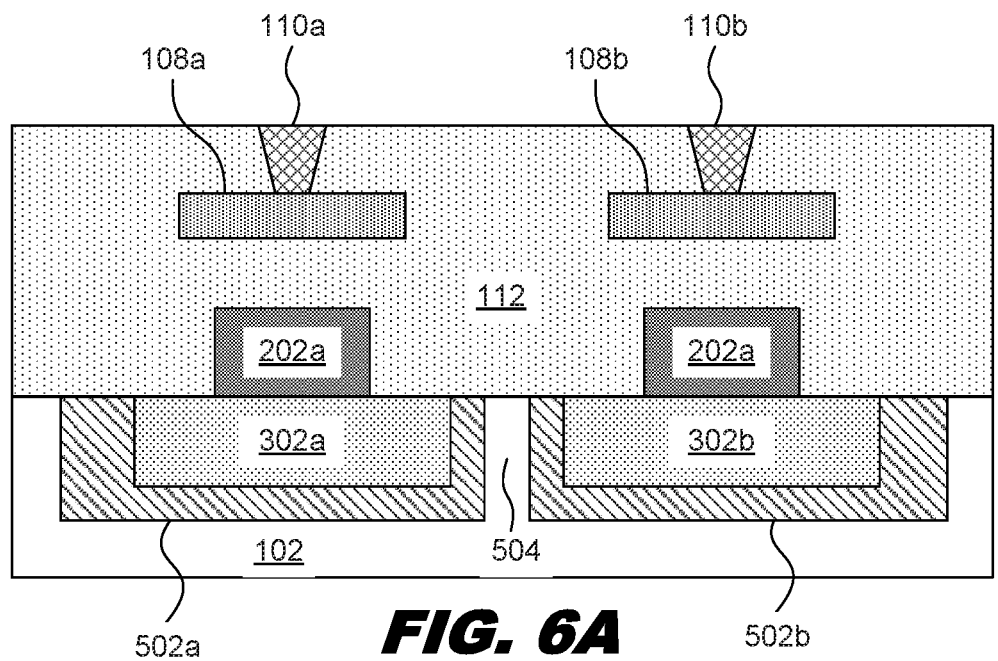
FIGS. 6A and 6B are diagrams showing a resistor array above an array of non-contiguous wells within non-contiguous wells of a different conductivity type and gate structures, according to one example of principles described herein.
Figure 6B:
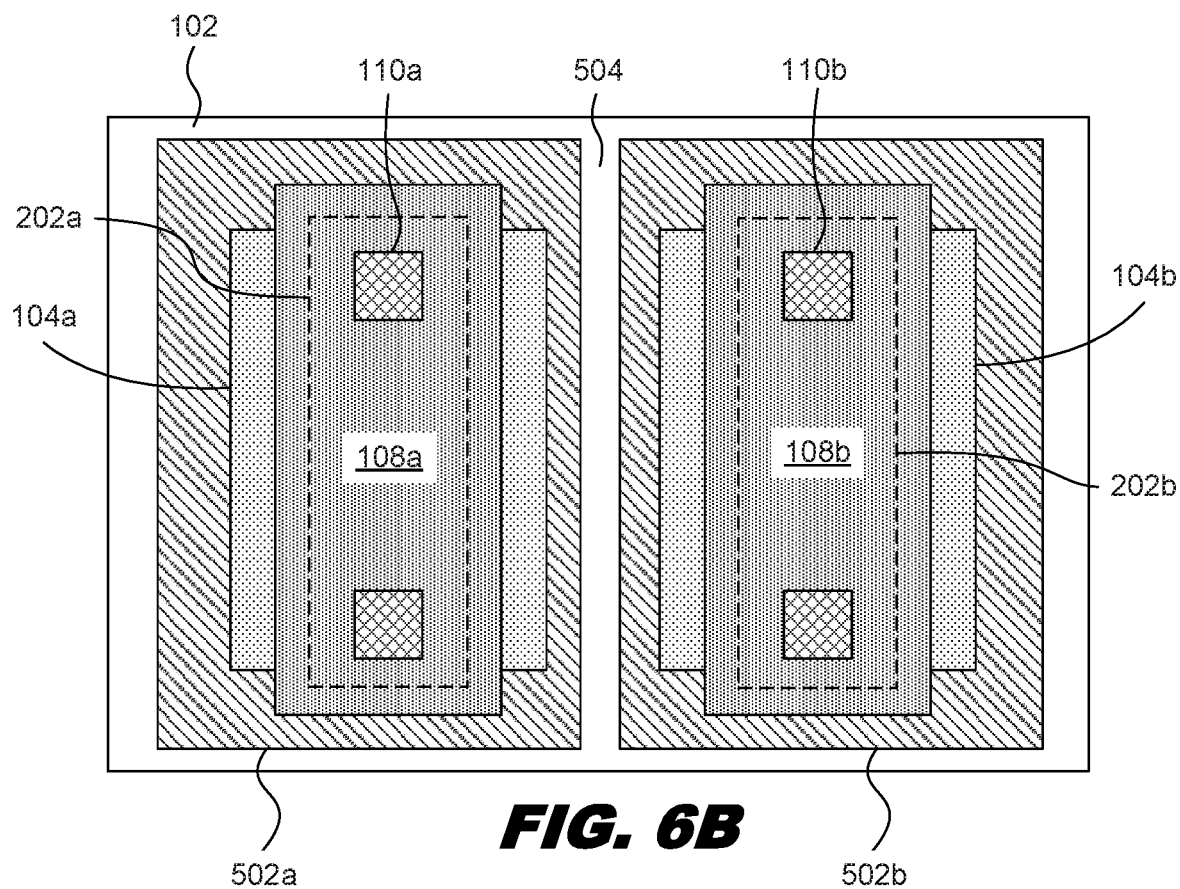

FIGS. 6A and 6B are diagrams showing a resistor array above an array of non-contiguous p-wells within non-contiguous n-wells and gate structures. FIG. 6A illustrates the substrate 102, isolated wells 302a, 302b of a first conductivity type, isolated wells 502a, 502b of a second conductivity type, an ILD layer 112, resistor elements 108a, 108b, and vias 110a, 110b. The substrate 102 may be a semiconductor substrate such as a silicon substrate. In some examples, the substrate 102 may be lightly doped with a p-type dopant such as boron.

The isolated wells 502a 502b may be formed into the substrate 102 before the isolated wells 302a, 302b are formed. In the present example, the isolated wells 502a, 502b are doped with an n-type dopant, such as Arsenic. Thus, the wells 502a, 502b may also be referred to as isolated n-wells 502a, 502b. The isolated n-wells 502a, 502b may have a higher doping concentration than that of the substrate 102. More specifically, the n-type dopant concentration of the isolated n-wells 502a, 502b may be greater than the p-type dopant concentration of the substrate 102. The isolated n-wells 502a, 502b may be formed by applying a doping process to the substrate. Various photolithographic techniques may be used to form the desired pattern of the isolated n-wells 502a, 502b. For example, a photoresist layer may be applied to the substrate. The photoresist layer may then be exposed to a light source through a photomask. The exposed photoresist layer may then be developed so that parts of the substrate 102 are exposed through removed portions of the photoresist layer. Then, a doping process, such as an ion implantation process, may be applied to the substrate.

After the isolated n-wells 502a, 502b are formed, the isolated wells 302a, 302b are formed. In the present example, the isolated wells 302a, 302b are p-wells and may thus be referred to as isolated p-wells 502a, 502b. However, in some examples, the isolated wells 302a, 302b may be n-wells and the isolated 502a, 502b may be p-wells. The isolated wells 302a, 302b may be formed by applying a doping process to the substrate. Various photolithographic techniques may be used to form the desired pattern of isolated wells 302a, 302b. For example, a photoresist layer may be applied to the substrate. The photoresist layer may then be exposed to a light source through a photomask. The exposed photoresist layer may then be developed so that parts of the substrate 102 are exposed through removed portions of the photoresist layer. Then, a doping process, such as an ion implantation process, may be applied to the substrate. The remaining portions of photoresist will protect the substrate from the doping process such that covered portions of the substrate are not doped. The isolated wells 302a, 302b may be doped with a p-type dopant. The concentration of p-type dopants in the isolated wells 302a, 302b may be similar to the concentration of dopants in the isolated n-wells 502a, 502b. In some examples, the isolated wells 302a, 302b and the isolated wells 502a, 502b may have different doping concentrations.

The isolated wells 502a, 502b may be formed such that there is an array of non-contiguous wells 502a, 502b. The gaps may be referred to as isolation regions. In the present example, the isolation region comprises a portion of the p-substrate 102. Thus, there are p-n junctions where the wells 502a, 502b meet the isolation region. In some examples, instead of a portion of the p-substrate 102 being within the isolation region, there may be other types of material. For example, a shallow trench isolation (STI) structure may be formed between the wells 302a, 302b.

After the isolated wells 302a, 302b are formed, gate structures 202a, 202b may be formed on top of the wells 302a, 302b. In some examples, the gate structures 202a, 202b may be dummy gate structures. In other words, the gate structures 202a, 202b may not serve a function in the integrated circuit being formed on the substrate 102. In some examples, the gate structures 202a, 202b may be real gate structures. In other words, the gate structures 202a, 202b may have a function within the integrated circuit being formed on the substrate 102. It may be desirable to form dummy gate structures for various fabrication benefits. For example, it may be beneficial to form dummy gate structures so that the pattern density of gate structures on the substrate is substantially similar throughout a particular region. This helps with depth of focus issues during the photolithographic process used to form gate structures 202a, 202b, including both dummy gate structures and real gate structures.

After the gate structures 202a, 202b are formed, an ILD layer 112 may be formed on top of the substrate 102. The ILD layer 112 is a dielectric layer. The ILD layer 112 have a number of circuit features formed therein such as metal conductive lines and vias. In the present example, a resistor array is formed within the ILD layer 112. The resistor array includes a first resistor element 108a and a second resistor element 108b. The first resistor element 108a extends between two vias 110a. Similarly, the second resistor element 108b extends between two vias 110b. The resistor elements 108a, 108b may be designed with particular lengths and materials so that they have the desired resistance.

FIG. 6B illustrates a top view of the resistor elements 108a, 108b. As can be seen, the resistor elements 108a, 108b are arranged as elongated conductive elements. From the top view, the elongated resistor elements 108a, 108b can be seen extending between vias 110a, 110b. Specifically, resistor element 108a extends between two vias 108a and resistor element 108b extends between two vias 110b. Additionally, each of the resistor elements is positioned above one of the isolated wells 302a, 302b. The isolated wells 302a, 302b can be seen positioned within the isolated wells 502a, 502b. Additionally, the position of the gate structures 202a, 202b is shown by dotted lines. As described above, the wells 302a, 302b, 502a, 502b are isolated from each other so as to reduce capacitive coupling between the two resistor elements 108a, 108b. In some examples, the isolated wells 302a, 302b may be floating. In other words, they may not be connected to a voltage supply line. In some examples, however, the isolated wells 302a, 302b may be connected to a voltage supply line. The substrate 102 may be grounded.

While FIGS. 1A-6B illustrate only two different resistor elements, practical implementations of resistor arrays will have a much larger number of resistor elements. Each of those resistor elements may be associated with its own isolated well in the various manners described above. Additionally, the various resistor elements and doped wells may have various dimensions. As illustrated, the doped wells have a greater width than the corresponding resistor elements. Additionally, as illustrated, the resistor elements have a greater length than the doped wells. In some examples, however, the resistor elements may have a smaller length than the doped wells and/or may have a larger width than the doped wells.

Figure 7A:
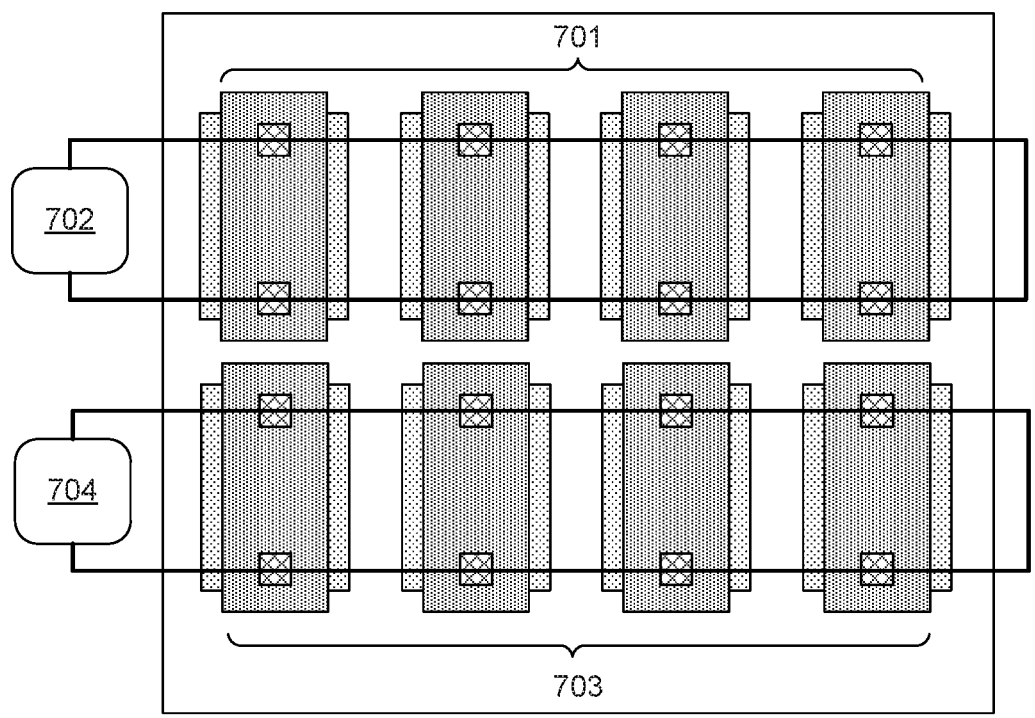
FIGS. 7A and 7B are diagrams showing resistor arrays in various circuit configurations, according to one example of principles described herein.
Figure 7B:
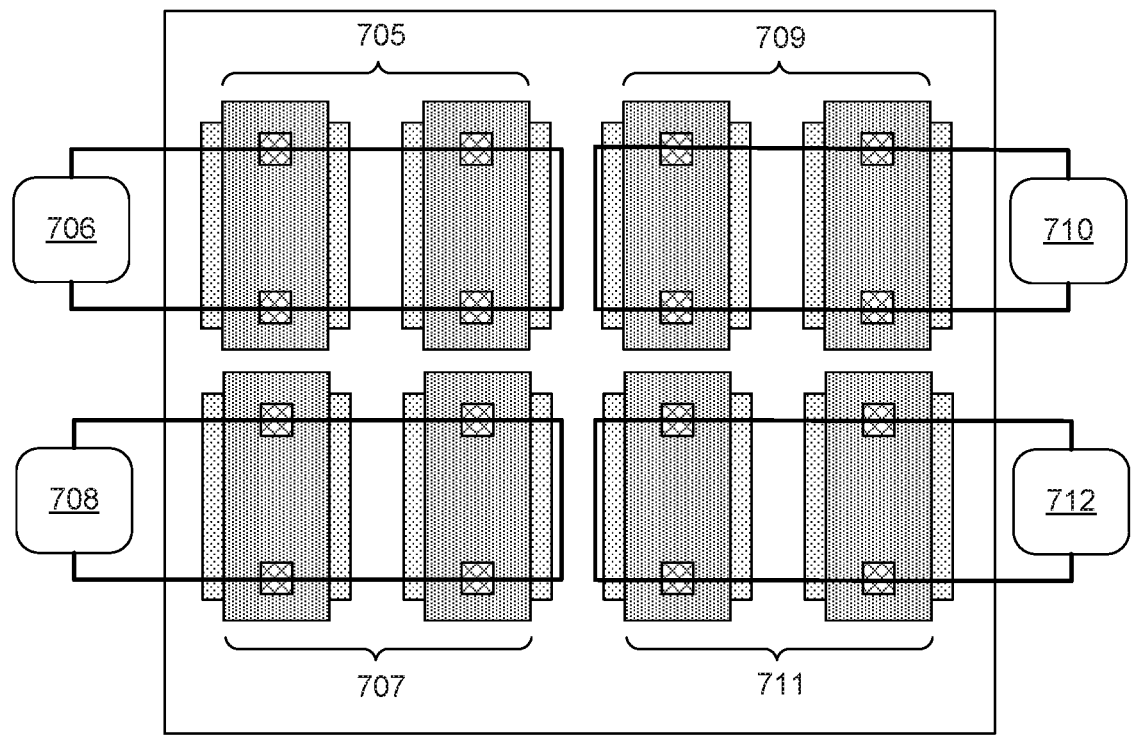

FIGS. 7A and 7B are diagrams showing resistor arrays in various circuit configurations. FIG. 7A illustrates an example in which a first circuit 702 that includes a first set 701 of four resistors and a second circuit 704 that includes a second set 703 of four resistors. Because the first set 701 is connected to a different circuit than the second set 703, different voltages can be applied to the different circuits 702, 704. For example, a non-zero voltage may be applied to the first circuit 702 while no voltage is applied to the second circuit 704, or vice versa. The lines associated with the circuits 702, 704 are intended to show electrical connection and do not necessarily represent the physical structure that provides the electrical connection. The physical structure that provides the electrical connection may include conductive lines formed into the ILD and in physical communication with the vias that are connected to the resistor elements.

FIG. 7B illustrates an example in which there are four separate circuits 706, 708, 710, 712. The first circuit 706 includes a first set 705 of two resistors. The second circuit 708 includes a second set 707 of two resistors. The third circuit 710 includes a third set 709 of two resistors. The fourth circuit 712 includes a fourth set 712 of two resistors. Again, different voltages may be applied to the different circuits 706, 708, 710, 712.

Figure 8:
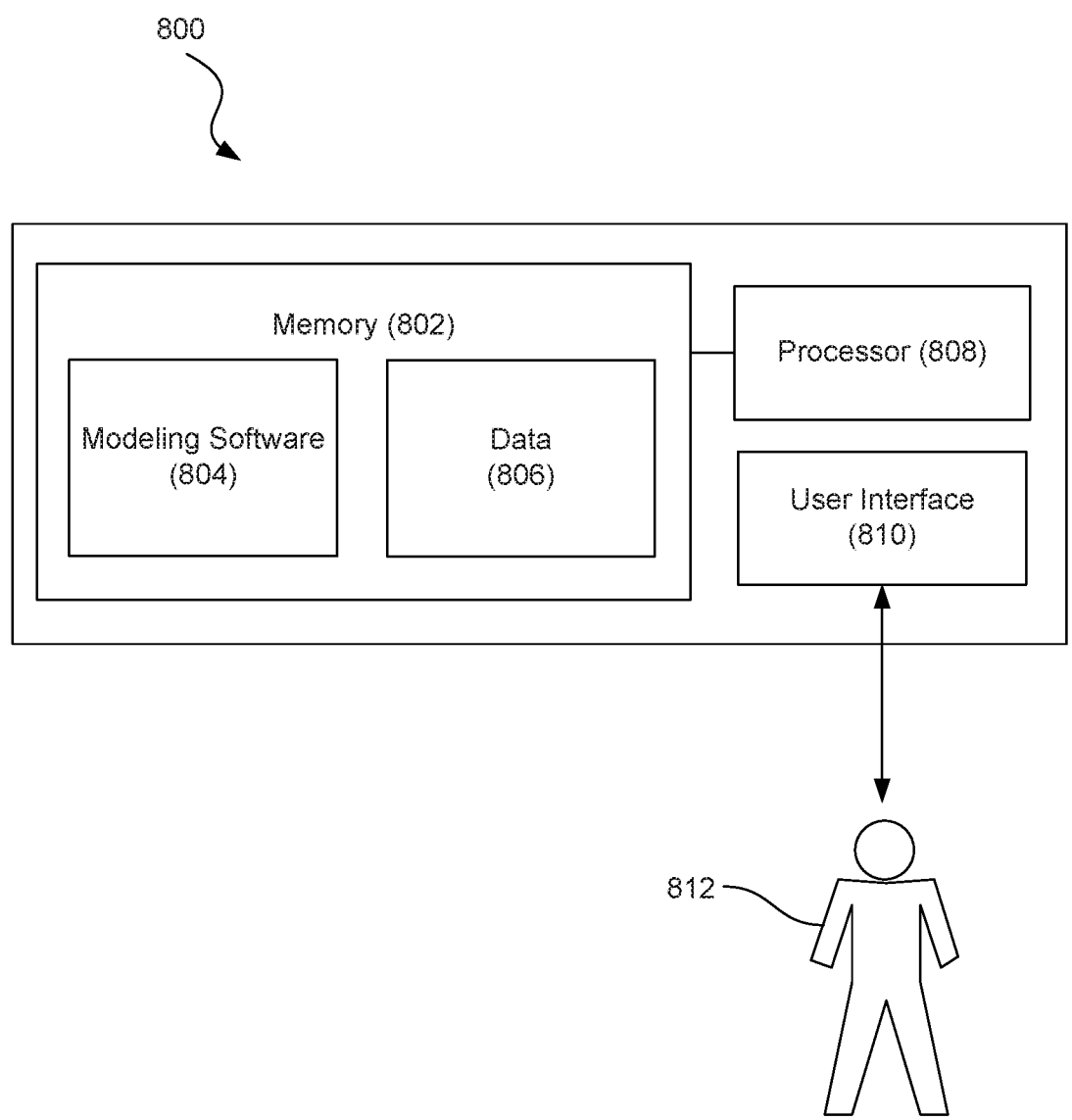
FIG. 8 is a diagram showing an illustrative computing system that may be used to simulate circuit designs, according to one example of principles described herein.

FIG. 8 is a diagram showing an illustrative computing system that may be used to simulate circuit designs. According to certain illustrative examples, the physical computing system 800 includes a memory 802 having modeling software 804 and data 806 stored thereon. The physical computing system 800 also includes a processor 808 and a user interface 810.

There are many types of memory available. Some types of memory, such as solid state drives, are designed for storage. These types of memory typically have large storage volume but relatively slow performance. Other types of memory, such as those used for Random Access Memory (RAM), are optimized for speed and are often referred to as "working memory." The various forms of memory may store information in the form of software 804 and data 806.

The modeling software 804 may include logic for creating or receiving circuit designs and simulating those designs under various conditions. Such designs may include resistor arrays over isolated wells as described above. Simulations may be applied in which not all of the resistors within an array are "on" at the same time. In other words, not all resistors may have a voltage applied at the same time. Because the resistors are formed over isolated wells, there is less capacitive coupling between the resistors in the array and thus such simulations can be performed with more reliability and accuracy.

The physical computing system 800 also includes a processor 808 for executing the software 804 and using or updating the data 806 stored in memory 802. In addition to storing the modeling software 804, the memory 802 may store an operating system. An operating system allows other applications to interact properly with the hardware of the physical computing system. The modeling software 804 may include the tools to form the lumped transmission line model and define the values of the components therein.

A user interface 810 may provide a means for a user 812 to interact with the system. The user may use various tools such as a keyboard or a mouse to input information into the physical computing system. Additionally, various output devices such as a monitor may be used to provide information to the user 812.

Figure 9:
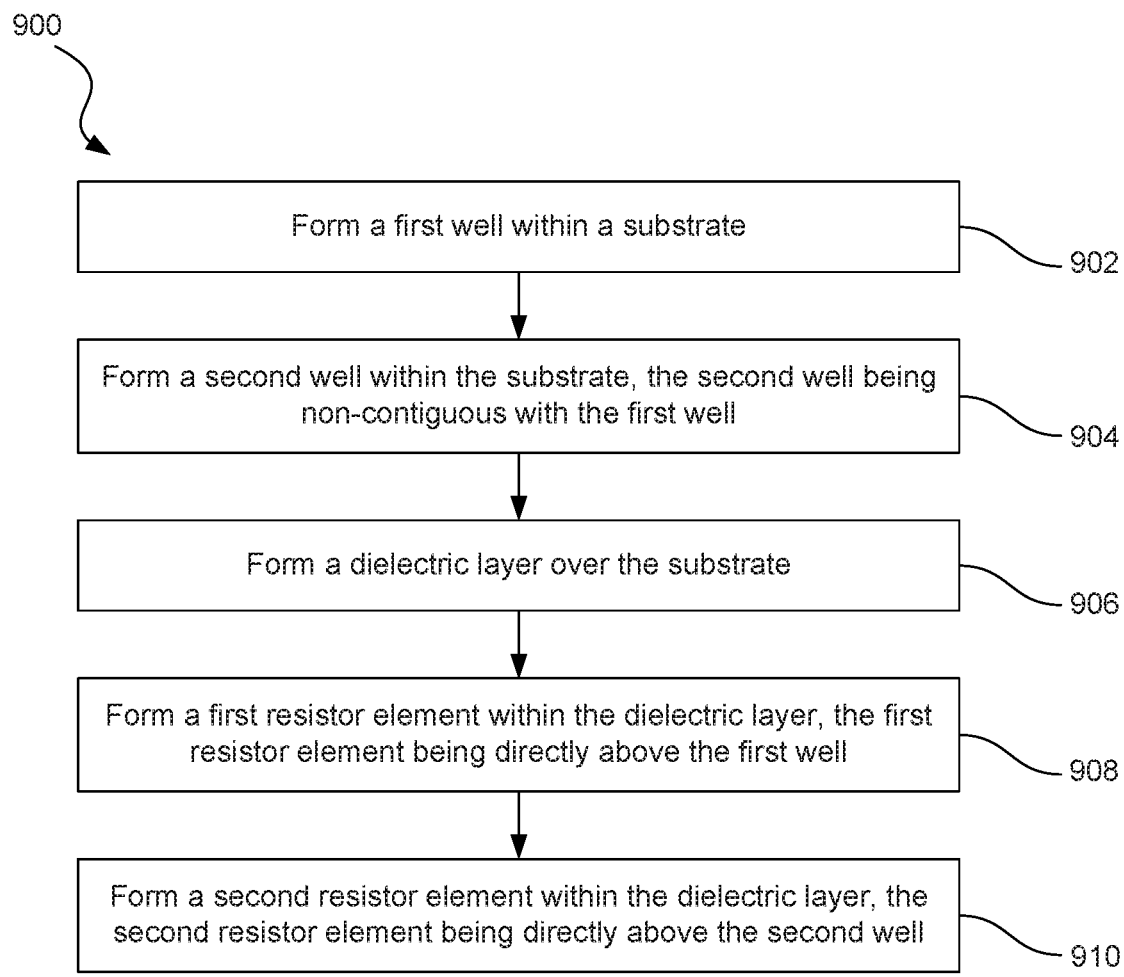
FIG. 9 is a flowchart showing an illustrative method for forming isolated wells for resistor arrays, according to one example of principles described herein.

FIG. 9 is a flowchart showing an illustrative method 900 for forming isolated wells for resistor arrays. According to the present example, the method 900 includes a step 902 for forming a first well within a substrate. The method 900 further includes a step 904 for forming a second well within the substrate, the second well being non-contiguous with the first well. In some examples, the first and second wells are n-wells. However, in some examples, the first and second wells may be p-wells. The first and second wells may be formed by applying a doping process to the substrate. Various photolithographic techniques may be used to form the desired pattern of the first and second wells. The first and second wells may be doped with an n-type dopant such as arsenic. The concentration of n-type dopants may be higher than the concentration of p-type dopants within the substrate 102. In alternative embodiments, a hard mask may be used as an implantation mask to form the first and second wells. For example, a hard mask layer, such as silicon oxide, silicon nitride or both, is deposited on the substrate; a patterned photoresist layer is formed on the hard mask layer by a lithography technique, where the patterned photoresist layer includes openings that define regions for the first and second wells; an etching process is applied to the hard mask layer to transfer the openings from the photoresist layer to the hard mask layer; and an ion implantation process is applied to the substrate to form the first and second wells using the patterned hard mask layer as an implantation mask.

The method 900 further includes a step 906 for forming a dielectric layer over the substrate. The dielectric layer may be, for example, an ILD layer. The ILD layer may be formed using various deposition techniques. The ILD layer may include several sub-layers of dielectric material.

The method 900 further includes a step 908 for forming a first resistor element within the dielectric layer, the first resistor element being directly above the first well. The method 900 further includes a step 910 for forming a second resistor element within the dielectric layer, the second resistor element being directly above the second well. The resistor elements may be formed by using a patterned photoresist or hardmask layer on top of the dielectric layer. Then, an etching process is used to etch trenches into the exposed portions of the dielectric layer through the photoresist or hardmask layer. Then, metal or other conductive material may be deposited within the trenches. A CMP process may then be applied to planarize the surface of the dielectric layer and top surfaces of the metal or conductive features that make up the resistor elements. Subsequent sub-layers of dielectric material may then be deposited on top of the resistor elements. Other features may be formed in the subsequent sub-layers. Such other features may include other resistor elements, conductive lines, and vias.

Figure 10:
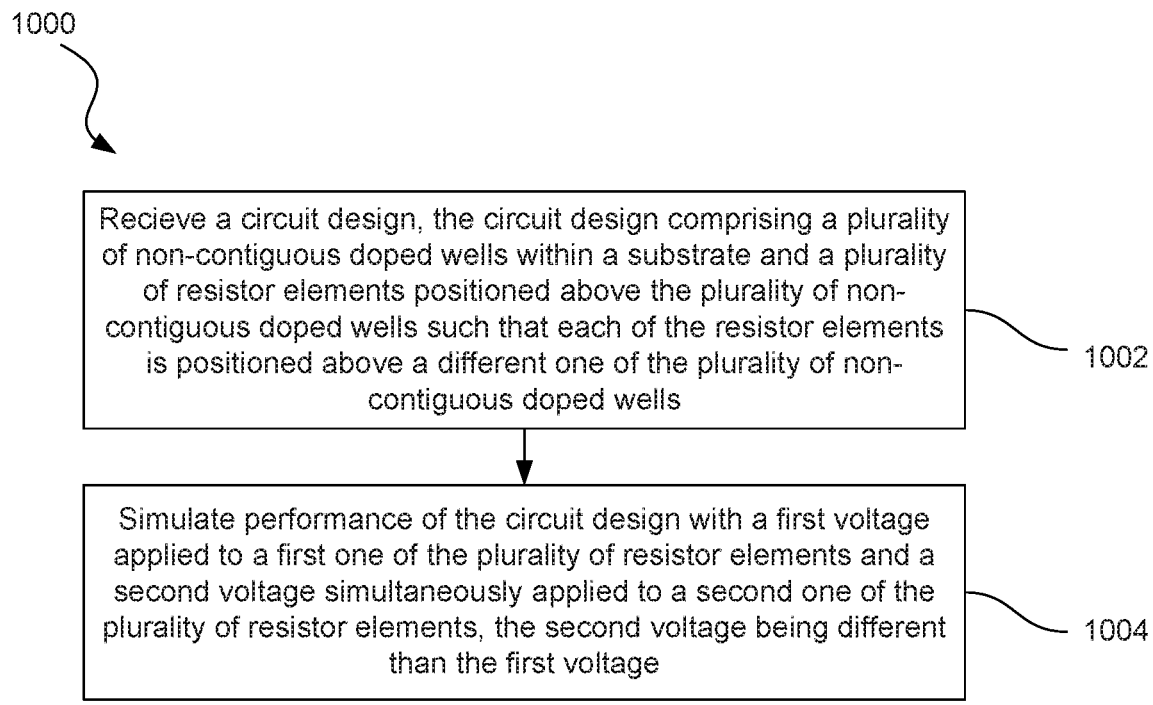
FIG. 10 is a flowchart showing an illustrative method for simulating a circuit design with isolated wells for resistor arrays, according to one example of principles described herein.

FIG. 10 is a flowchart showing an illustrative method 1000 for simulating a circuit design with isolated wells for resistor arrays. According to the present example, the method 1000 includes a step 1002 for receiving a circuit design, the circuit design comprising a plurality of non-contiguous doped wells within a substrate and a plurality of resistor elements positioned above the plurality of non-contiguous doped wells such that each of the resistor elements is positioned above a different one of the plurality of non-contiguous doped wells. The method 1000 further includes a step 1004 for simulating performance of the circuit design with a first voltage applied to a first one of the plurality of resistor elements and a second voltage simultaneously applied to a second one of the plurality of resistor elements, the second voltage being different than the first voltage.

Simulating the performance of a circuit is valuable for testing and diagnostic purposes. For example, when a new design is created, it may be desirable to determine how the device will perform under a variety of conditions. Simulation of the design can thus provide the designer with valuable information as to how the circuit will perform. Using principles described herein, simulations in which some of the resistors in an array are on while some are off can be applied with more accuracy. In other words, during the simulation, one voltage may be applied to one resistor within the array and a different voltage may be applied to another resistor within the array. Because of the isolated wells described herein, operation of one resistor will have less of an effect on adjacent resistors. Without the isolated wells described herein, any simulation in which different voltages are applied to different resistors within the array will not be as accurate. Thus, the simulation cannot test certain situations in which it may be desirable for the circuit to perform.

Furthermore, if it is determined that the circuit does not behave as desired, then the designer may adjust the circuit design. Such adjustments may be, for example, the spacing of the resistor elements. Such adjustments may also include changing the properties of the resistor elements. For example, the resistance of the resistor elements may be changed by adjusting the size of the resistor elements or by adjusting the material used to form the resistors.

Figure 11:
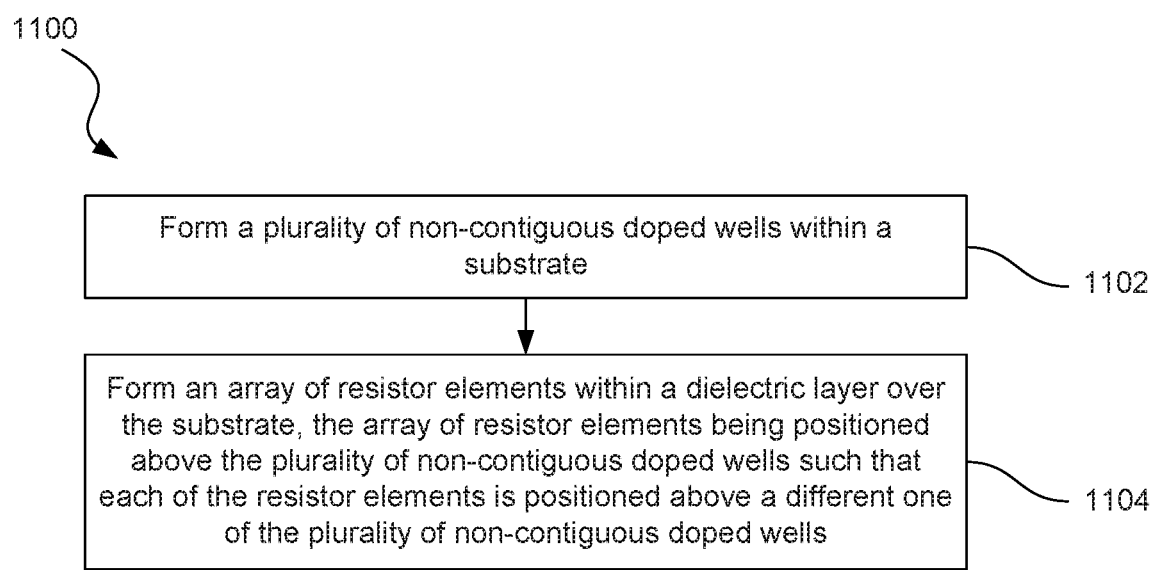
FIG. 11 is a flowchart showing an illustrative method for forming isolated wells for resistor arrays, according to one example of principles described herein.

FIG. 11 is a flowchart showing an illustrative method for forming isolated wells for resistor arrays. The method 1100 includes a step 1102 for forming a plurality of non-contiguous doped wells within a substrate. The method 1100 further includes a step 1104 for forming an array of resistor elements within a dielectric layer over the substrate, the array of resistor elements being positioned above the plurality of non-contiguous doped wells such that each of the resistor elements is positioned above a different one of the plurality of non-contiguous doped wells.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   a dielectric layer over the substrate;
   a first resistor element embedded within the dielectric layer, the first resistor element comprising a straight line extending in a first single direction;
   a second resistor element embedded within the dielectric layer, the second resistor element comprising a straight line extending in a second single direction, the first resistor element being adjacent the second resistor element;
   a first doped well within the substrate, the first doped well being aligned with the first resistor element; and
   a second doped well within the substrate, the second doped well being aligned with the second resistor element, the second doped well being non-contiguous with the first doped well;
   wherein the first resistor element has a longitudinal length that extends beyond the first doped well.

2. The semiconductor device of claim 1, wherein the first doped well and the second doped well are n-wells.

3. The semiconductor device of claim 1, wherein a portion of the substrate separates the first doped well from the second doped well.

4. The semiconductor device of claim 1, wherein the first doped well and the second doped well are floating wells.

5. The semiconductor device of claim 1, wherein the first doped well and the second doped well are in electrical communication with a voltage line.

6. The semiconductor device of claim 1, further comprising, a first gate structure disposed on the first doped well and a second gate structure disposed on the second doped well.

7. The semiconductor device of claim 1, wherein a width of the first resistor element is less than a width of the first doped well.

8. The semiconductor device of claim 1, wherein the first doped well and the second doped well are p-wells.

9. The semiconductor device of claim 8, further comprising an n-well surrounding both the first doped well and the second doped well, the n-well separating the first doped well and the second doped well from the substrate.

10. The semiconductor device of claim 9, wherein the n-well is a floating n-well.

11. The semiconductor device of claim 9, wherein the n-well is connected to a voltage source.

12. The semiconductor device of claim 8, further comprising:
    a first n-well surrounding the first doped well and separating the first doped well from the substrate; and
    a second n-well surrounding the second doped well and separating the second doped well from the substrate, the second n-well being non-contiguous with the first doped well.

13. The semiconductor device of claim 12, wherein the first doped well and the second doped well are grounded.

14. The semiconductor device of claim 1, wherein the first resistor element and the second resistor element are connected to separate lines such that different voltages can be applied to the first and second resistor elements.

15. A semiconductor device comprising:
    a plurality of non-contiguous doped wells within a substrate;
    a dielectric layer over the substrate; and
    an array of adjacent resistor elements positioned within the dielectric layer and above the plurality of non-contiguous doped wells such that each of the resistor elements is positioned above a different one of the plurality of non-contiguous doped wells, each one of the resistor elements comprising an elongated, straight line extending in a single direction that extends beyond the plurality of non-contiguous doped wells.

16. The semiconductor device of claim 15, wherein the non-contiguous doped wells are separated by portions of the substrate with a different doping concentration and type.

17. The semiconductor device of claim 15, wherein the non-contiguous doped wells are separated by Shallow Trench Isolation (STI) features.

18. A semiconductor device comprising:
    a substrate comprising:
      a first well; and
      a second well that is non-contiguous with the first well; and
    a dielectric layer over the substrate, the dielectric layer comprising;
      a first elongated, straight resistor element embedded within, the first resistor element aligned with the first well, the first elongated, straight resistor element having a longitudinal length that is greater than that of the first well; and
      a second elongated, straight resistor element embedded within, the second resistor element aligned with the second well, the second resistor element being adjacent the first resistor element without other resistor elements therebetween;
    wherein the first resistor element is part of a first circuit and the second resistor element is part of a second circuit that is separate from the first circuit such that different voltages can be applied to the first and second resistor elements.

19. The semiconductor device of claim 18, further comprising, gate structures positioned above the first and second wells.

20. The semiconductor device of claim 18, wherein the first and second wells are separated from each other by at least 10 nanometers.

* * * * *